(12) United States Patent
Rochat et al.

(10) Patent No.: US 9,004,913 B2
(45) Date of Patent: Apr. 14, 2015

(54) GAS BURNER

(75) Inventors: Gil Rochat, Mezieres (CH); Pierre Fayet, Lausanne (CH); Thomas Richter, Jena (DE); Bernhard Zobel, Jena (DE)

(73) Assignee: Tetral Laval Holdings & Finance S.A., Pully (CH)

( * ) Notice: Subject to any disclaimer, the term of this patent is extended or adjusted under 35 U.S.C. 154(b) by 612 days.

(21) Appl. No.: 12/864,376

(22) PCT Filed: Jan. 20, 2009

(86) PCT No.: PCT/CH2009/000021
§ 371 (c)(1),
(2), (4) Date: Oct. 12, 2010

(87) PCT Pub. No.: WO2009/094791
PCT Pub. Date: Aug. 6, 2009

(65) Prior Publication Data
US 2011/0244411 A1    Oct. 6, 2011

(30) Foreign Application Priority Data
Jan. 28, 2008   (CH) ........................................ 114/08

(51) Int. Cl.
*F23D 14/62*    (2006.01)
*F23D 14/58*    (2006.01)
(Continued)

(52) U.S. Cl.
CPC .............. *F23D 14/586* (2013.01); *F23D 14/10* (2013.01); *F23D 99/003* (2013.01)

(58) Field of Classification Search
CPC ......... F23D 14/02; F23D 14/08; F23D 14/62; F23D 14/84; F23D 14/68; F23D 14/10; F23D 14/586; F23D 99/003; F23D 14/14; Y02E 20/344; B82Y 30/00; B82Y 40/00; C01B 31/0206
USPC ........... 431/354, 328, 326, 329, 92 AC, 92 B, 431/92 C, 39 D
See application file for complete search history.

(56) References Cited

U.S. PATENT DOCUMENTS 2,407,878 A * 9/1946 Greetham ........................ 65/268
5,571,009 A * 11/1996 Stålhane et al. ............... 431/328
(Continued)

FOREIGN PATENT DOCUMENTS

CN   1584398    2/2005
DE   1 054 038  4/1959
(Continued)

*Primary Examiner* — Kenneth Rinehart
*Assistant Examiner* — Bao D Nguyen
(74) *Attorney, Agent, or Firm* — Rankin, Hill & Clark LLP (57) ABSTRACT

A gas burner, which is particularly suitable for flame treatment of substrates having large surfaces, e.g. for coating such surfaces in a combustion chemical vapor deposition (CCVD) process, includes a burner body with a gas supply connection and a nozzle plate, wherein the burner body and the nozzle plate constitute together a gas plenum and the nozzle plate constitutes a perforated wall section of the plenum. The nozzle plate includes a large number of nozzles extending from a plenum side to a flame side of the nozzle plate and it is made of a plurality of sheets which are arranged in a stack and extend substantially perpendicular or substantially parallel to the nozzle extension. The sheets include through openings, wherein the through openings of all sheets are at least partly aligned with each other, or they have a comb-like form.

14 Claims, 4 Drawing Sheets

(51) Int. Cl.
*F23D 14/10* (2006.01)
*F23D 99/00* (2010.01)

(56) References Cited

U.S. PATENT DOCUMENTS

| | | | |
|---|---|---|---|
| 2003/0044342 A1* | 3/2003 | Alford et al. | 423/445 R |
| 2003/0113679 A1 | 6/2003 | Bakshi et al. | |
| 2006/0003279 A1* | 1/2006 | Best | 431/328 |
| 2009/0199964 A1* | 8/2009 | Fayet et al. | 156/278 |

FOREIGN PATENT DOCUMENTS

| | | |
|---|---|---|
| EP | 0774623 | 5/1997 |
| JP | 55157886 | 11/1980 |
| JP | 6266013 | 3/1987 |
| JP | 1089631 | 4/1998 |
| JP | 10160121 | 6/1998 |
| JP | 2001263614 | 9/2001 |
| NL | 6 515 978 | 12/1966 |
| WO | 01/57438 | 8/2001 |
| WO | 2007/051340 | 5/2007 |

* cited by examiner

GAS BURNER

BACKGROUND OF THE INVENTION

1. Field of the Invention

The invention concerns a gas burner according to the generic part of the independent claim. The gas burner is suitable for establishing an array of flames with characteristics such that it is applicable e.g. in a device for flame treatment of substrate surfaces, in particular for flame treatment of large substrate surfaces, e.g. in order to activate the surfaces or in order to coat the surfaces in a so called combustion chemical vapor deposition (CCVD) process.

2. Description of Related Art

Installations for flame treatment of substrates having large surfaces, e.g. of quasi endless webs of polymer film, paper board, metal foil, extruded melt curtains or combinations thereof are usually equipped with a gas burner or a plurality of gas burners and with means (e.g. rotating drum) for moving the substrate through or past the flame array produced by the gas burner(s). The flame arrays usually have the form of flame bands which span a substrate width perpendicular to the moving direction of the substrate. Such an installation is e.g. described in the publication WO 2007/051340.

The treatment quality which can be achieved by the flame treatment process carried out in an installation of the named type is relevantly dependent on the homogeneity of the flame band in particular over its length, i.e. perpendicular to the moving direction of the substrate and on the temporal constancy of this homogeneity. For achieving this homogeneity, a flame array with a relatively high density of flames is needed, wherein the flames have to have characteristics as similar as possible and have to be able to burn with a high constancy for as long as possible.

Known gas burners for establishing flame arrays usually comprise a gas plenum with a gas supply connection and with a perforated wall section on its one side, wherein the supplied gas exits the plenum through the perforated wall to be burnt on the outside of this wall. For a high density of flames, the perforated plenum wall comprises e.g. a package of superimposed corrugated metal strips, a porous refractory element or a pack of a plurality of porous refractory plates such as e.g. described in the publication US2003/044342. With such a perforated plenum wall section, it is possible to achieve a high density of small nozzles of a sufficient length. However, the nozzle cross sections and the nozzle lengths vary substantially randomly within a range of cross sections and lengths, which proves to be non-sufficient for surface treatment applications on a very high quality level.

Known burners which are able to suffice the above named conditions for being suitable for high quality flame treatment comprise, as a perforated wall section of the gas plenum, a one-piece metal nozzle plate which is e.g. made of bronze. However, such a nozzle plate needs a high density of small nozzles of a relatively high aspect ratio, which, for the necessary accuracy, need to be made by drilling. The drilling operation puts an upper limit to the aspect ratio and is combined with high machine and/or labor cost.

The publication WO 01/57438 discloses a gas burner, which comprises a tube-shaped burner body with a plurality of slit-like through openings arranged side by side. In addition, on the burner body, a protection shield is arranged, which also comprises through openings, whose position and form is adapted to the through openings of the burner body. The protection shield serves to protect the burner body from excessive heat exposure.

The publication DE 26 05 954 discloses a gas burner, whose nozzle plate is formed by a plurality of folded sheet elements, which are arranged in an intertwining manner. In this way, nozzles for the gas are formed. As folded sheets are used it can happen that the faces of the sheets do not lie exactly against each other, so that the gas flows through the space between the sheets in an undefined manner. In addition, the openings are not throughout, but the gas flows around the corners of the sheet elements. Therefore, no exact and stable burning conditions can be achieved.

It is the object of the invention to create a gas burner for establishing a flame array, wherein the flame array is to be at least as suited for highest quality flame treatment of large substrate surfaces as the above mentioned known burner comprising a one-piece metal nozzle plate, but wherein the device is to be able to be produced with relevantly simpler means and all the same high accuracy. Furthermore, the production of the burner is not to limit the aspect ratio of the nozzles.

BRIEF SUMMARY OF THE INVENTION

This object is achieved by the gas burner as defined in the independent claim. The dependent claims define preferred embodiments of the gas burner according to the invention.

The gas burner according to the invention comprises, like known burners used for the same purpose, a burner body with a gas supply connection and a nozzle plate, the burner body and the nozzle plate constituting a gas plenum and the nozzle plate constituting a perforated wall section of the gas plenum. The nozzle plate of the gas burner, according to the invention, comprises a stack-like arrangement of a plurality of sheets, wherein the sheets are formed and arranged in the stack such that the stack comprises a plurality of nozzles extending from a plenum side to a flame side of the nozzle plate. The nozzle plate is preferably an element which is formed independently from the burner body. i.e., the nozzle plate can be manufactured independently from the burner body. Hence, the nozzle plate can be manufactured from the desired number of sheets and subsequently can be connected to the burner body. In the region where the nozzle plate is affixed to the burner body, the burner body can be open or can feature a wall with through openings for the gas.

By means of a combination of several sheets, particularly of at least three sheets, preferably nozzle openings are formed having a diameter which is in the longest direction smaller than their lengths in the stream out direction of the gas.

The sheets may extend substantially perpendicular to the nozzle length and comprise determinate through openings (in contrast to the random through openings of a porous plate), wherein the through openings of all the sheets are at least partly aligned to each other in the stack to form the nozzles. While retaining a constant opening width (diameter) of the nozzle, the nozzle length can easily be extended by increasing the number of sheets.

The sheets may also extend substantially parallel to the nozzle length, wherein at least a part of the sheets have a comb-like form with a serrated edge, which faces towards the flame side of the nozzle plate. The gaps between the comb-like arranged teeth in a sheet form together with the neighbouring sheets nozzles. Hence, the gaps can be manufactured without big effort with a relatively high ratio between length and diameter. The gaps can particularly be formed by means of punching from a thin sheet material. This is in contrast to the method of drilling through a thick nozzle plate made of one piece, which delimits the nozzle on all sides as mentioned at the beginning.

The nozzle plates of the burner, according to the invention, have typically a rectangular form with a width (extending in the treatment device parallel to the substrate motion) of a number of centimeters (e.g. 3 to 20 cm), a length of up to a few meters (e.g. 1 to 3 m) and a thickness of between 5 to 20 mm. The nozzles which reach through the nozzle plate from a plenum side to a flame side thereof have, advantageously, cross sections having dimensions in the range of 0.5 to 2 mm and distances from each other in about the same range. This results in aspect ratios of between about 2.5 and 40 at a nozzle density in the order of e.g. 0.25 or 0.5 nozzles per mm 2.

The sheets consist e.g. of a metal, preferably of steel (e.g. carbon steel or oxidation-proof steel) but may consist also of brass or bronze. They typically have a thickness of 0.5 to 2 mm (preferably between 0.8 and 1.5 mm, even more preferably 1 mm). Such metal sheet material is available on the market even structured with a pattern of determinate openings (perforated metal sheet) suitable for the purpose. The sheet material can be cut to size and possibly equipped with through openings or a serrated edge e.g. with the aid of a laser (laser cutting), by jet cutting or by milling. They are preferably produced by punching using a punch tool which is able to either simultaneously punch one complete sheet or to produce sheets by continuous punching of a quasi endless strip of the sheet material.

For making the nozzle plate from the sheets, a plurality of the sheets is stacked and the sheets in the stack are fixed to each other, wherein the fixing means may be part of the burner body or may constitute an additional part of the nozzle plate. It is also possible, to weld the sheets together along at least part of their edges. For forming a stack, the sheets are preferably flat and straight, i.e. they feature a planar upper and lower side in each case. Within the nozzle plate, the upper and lower side of neighbouring sheets lie surface upon surface, so that in the area of contact preferably no gas can pass through. As the sheets preferably are not bent, neighbouring layers, which commonly delimit or define a nozzle, can easily be displaced relatively to each other and hence can be exactly aligned relative to each other. By moving the sheets relative to each other, the cross section of the nozzle openings can be varied according to the specification.

Flame arrays produced by burners according to the invention are able to satisfy the highest standards regarding flame treatment quality and are considerably less demanding regarding production than the known one-piece bronze nozzle plates. A further advantage of the burner according to the invention is the simplicity of production of nozzle plates or adaptation of one nozzle plate for differing requirements (differing treatments, differing gases etc.), wherein from only a small number of different sheet types, it is possible to produce a large number of different nozzle plates by stacking different numbers of sheets and/or different types of sheets. Furthermore, it is possible to combine sheets of different materials, e.g. one sheet of a highly heat and oxidation resistant and, therefore, expensive material to constitute the flame side of the nozzle plate and a plurality of further sheets of a less resistant and therefore less expensive material constituting the plenum side of the nozzle plate. A further advantage of the burner, according to the invention, is the fact that removal of the nozzle plate from the burner body and separation of the sheets enables easy and thorough cleaning of the nozzles, which gives the nozzle plate a long service life.

BRIEF DESCRIPTION OF THE DRAWINGS

The gas burner according to the invention is described in further detail in connection with the following Figs., wherein.

DETAILED DESCRIPTION OF THE INVENTION

Figure 1:
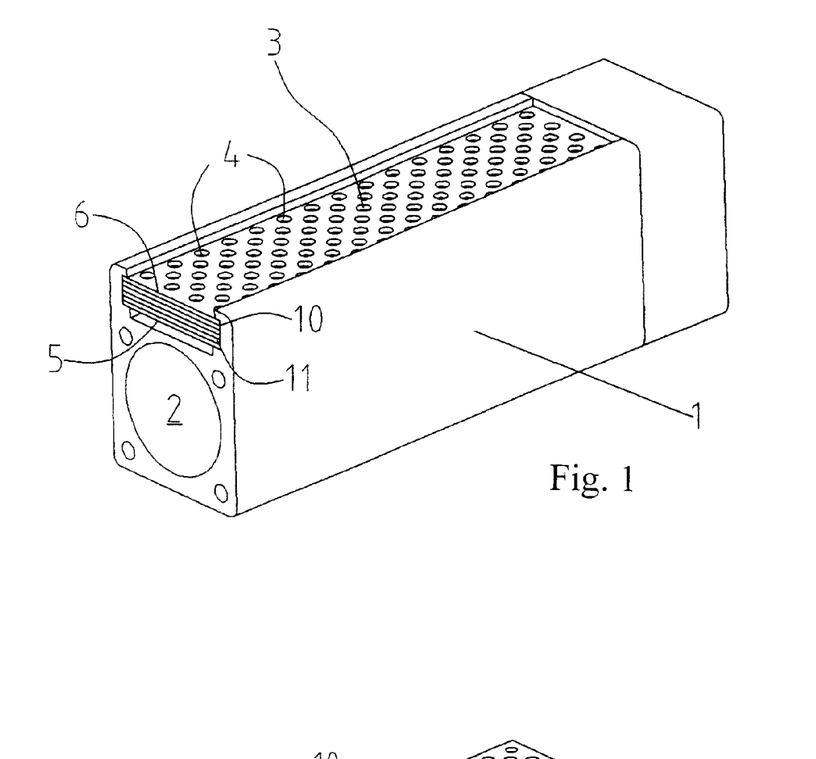
FIG. 1 shows a first exemplary embodiment of the gas burner according to the invention, wherein the sheets of the nozzle plate are arranged substantially perpendicular to the nozzle length.

FIG. 1 shows a first exemplary embodiment of the gas burner according to the invention, which gas burner comprises a burner body 1 with a gas supply connection 2 and a nozzle plate 3, wherein the burner body 1 and the nozzle plate 3 constitute together a gas plenum and the nozzle plate 3 constitutes a perforated wall section of the plenum. The nozzles 4 of the nozzle plate 3 reach from a plenum side 5 to a flame side 6 of the nozzle plate 3. For ease of illustration, the relations between dimensions of the burner according to FIG. 1 do not coincide with the relations of a real burner. In particular, the burner body will usually be longer and the nozzles will be smaller and nearer together than illustrated.

The nozzle plate 3 comprises a plurality of sheets 10 (e.g. six sheets, as illustrated in FIG. 1) which extend substantially perpendicular to the length of the nozzles, comprise determinate through openings and are stacked such that the through openings of each sheet are sufficiently aligned with openings of all other sheets of the stack to form the nozzles.

The stack of sheets 10 is e.g. kept together and in place relative to the burner body 1 by corresponding grooves 11 extending over the length of the burner body. The stack may be additionally stabilized by rivets or bolts extending through corresponding bores reaching through the whole stack or through a small number of the nozzles or by welded connections along the sheet edges.

Figure 2:
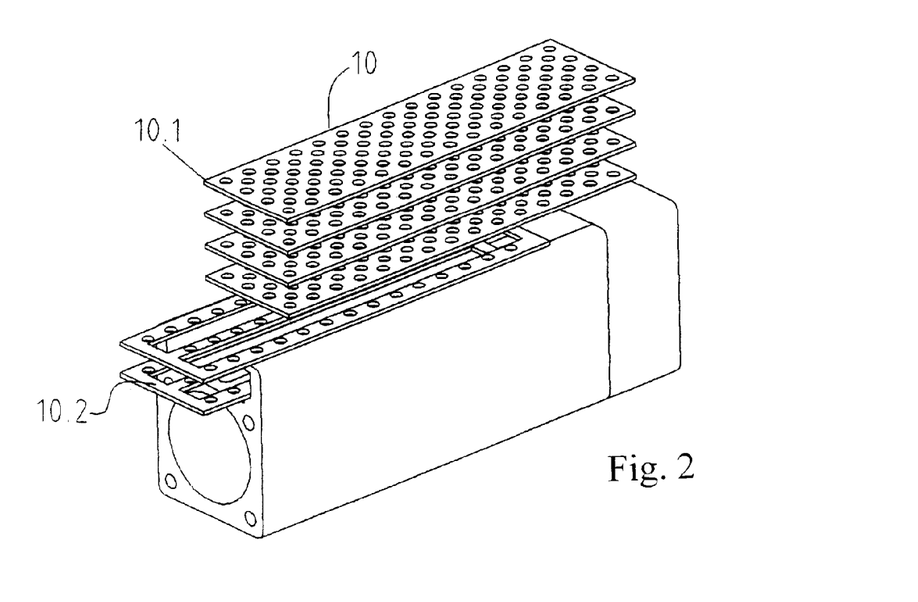
FIGS. 2 to 4 show the nozzle plate of the burner embodiment according to FIG. 1 in an exploded illustration (FIG. 2), viewed from the flame side (FIG. 3) and viewed from the plenum side (FIG. 4)

FIG. 2 shows in further detail the six sheets 10 of the nozzle plate 3 of the burner according to FIG. 1 which six sheets are of two different sheet types. Four first type sheets 10.1 constituting the flame side 6 of the nozzle plate 3 comprise a pattern of e.g. circular through openings (bores), wherein each one of the openings feeds one flame of the flame array to be produced with the burner. The first type sheets 10.1 are e.g. made of perforated metal sheet material comprising a regular pattern of bores arranged in rows extending parallel to sheet edges, wherein the bores of one specific row are aligned to spaces between bores in neighboring rows. Such perforated sheet material of steel is available on the market.

At least one (illustrated two) second type sheet 10.2 constitutes the plenum side 5 of the nozzle plate. These sheets 10.2 comprise a part of the same pattern of through openings as the first type sheets 10.1 and instead of another part of this pattern, they comprise substantially rectangular through openings extending parallel to the sheet length and e.g. having the same width as two bore rows. The second type sheets 10.2 are preferably made of the same perforated metal sheet material as the first type sheets by cutting the rectangular openings and removing part of the bore rows.

Figure 3:
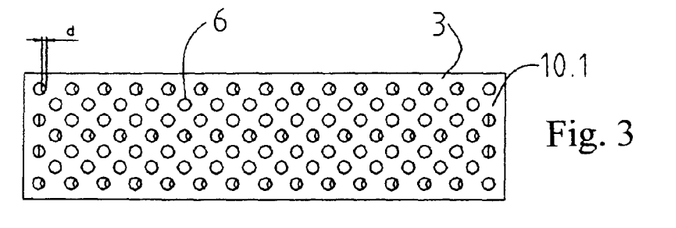
Figure 4:
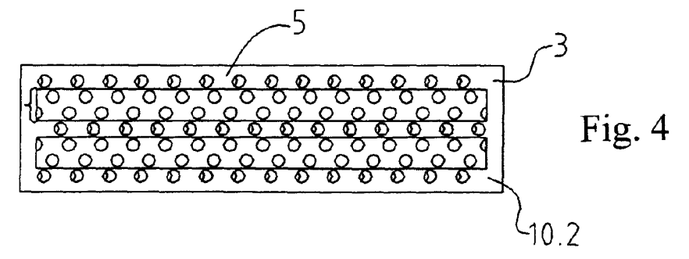

As seen from FIGS. 3 and 4 which show the nozzle plate 3 of the burner according to FIG. 1 from the flame side 6 (FIG. 3) and from the plenum side 5 (FIG. 4), the bores of the second type sheets 10.2 are displaced in the row direction by a bore displacement d being smaller than the bore diameter such that the effective cross section of the corresponding nozzles is reduced. The bores of the rows which are aligned with the rectangular through openings on the other hand comprises an effective cross section which corresponds to the bore cross section. The nozzle rows having the larger cross section may serve for feeding treatment flames, whereas the nozzles with the reduced cross section serve for feeding smaller supporting flames which are necessary for sustaining the larger treatment flames.

The exemplary nozzle plate illustrated in FIGS. 2 to 4 produces a flame band comprising two bands of two rows of treatment flames and on each side and between the bands one row each of supporting flames. By stacking first type sheets 10.1 according to FIG. 2 with second type sheets comprising other, possibly from sheet to sheet differing patterns of bores and rectangular openings and/or with different displacement of the bore pattern, it becomes possible to produce flame bands of the most varied patterns of flames of different sizes, wherein manufacturing of the nozzle plate 3 remains substantially the same and always very simple.

Of course it is possible also to arrange the sheets in the burner such that they remain displaceable relative to each other such that e.g. the nozzle cross section of at least part of the nozzles can be adapted to varying requirements without dismantling the burner and the nozzle plate.

Instead of using a displacement of bores of the same cross section for reduction of the effective cross section of some of the nozzles, it is possible also to use sheets with smaller bores and arrange them such that the smaller bores are aligned with the larger bores of the other sheets.

Obviously, it is possible also to make a nozzle plate of only first type sheets wherein all bores of all sheets may be exactly or partly aligned to each other. By providing a selection of sheets with such differing displacements, it becomes possible to set the effective nozzle cross section in an easy manner, namely by selecting a sheet having the corresponding bore displacement and positioning it on the plenum side of the nozzle plate.

For any of the above described cases it is of course possible also to design the through openings or the nozzles respectively having non-circular cross sections, but instead having e.g. square, rectangular or polygonal cross sections.

Figure 5:
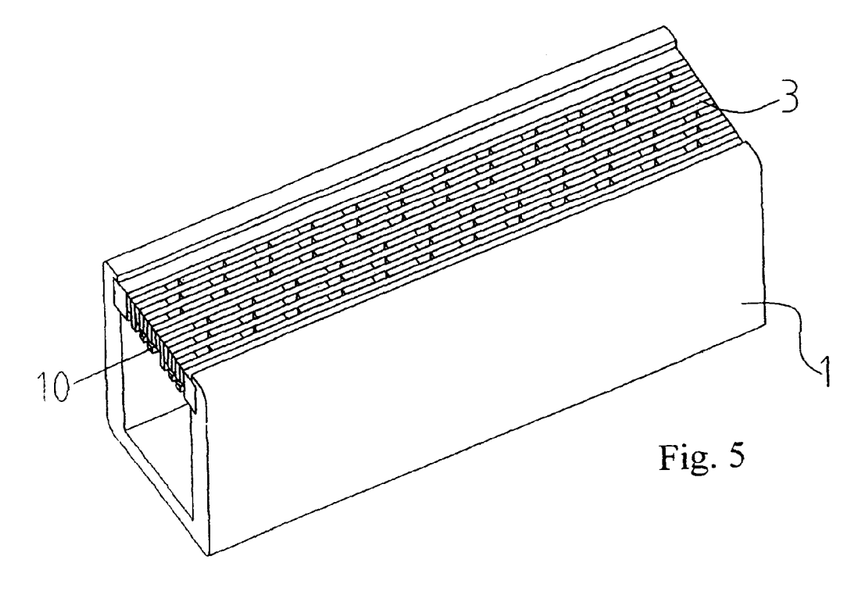
FIG. 5 shows a second exemplary embodiment of the gas burner according to the invention, wherein the sheets of the nozzle plate are arranged substantially parallel to the nozzle length.

FIG. 5 shows a further exemplary embodiment of the burner according to the invention. The burner again comprises a burner body 1 and a nozzle plate 3, wherein the sheets 10 constituting the nozzle plate 3 are oriented substantially parallel to the nozzle extension and preferably parallel to the length of the burner body.

Figure 6:
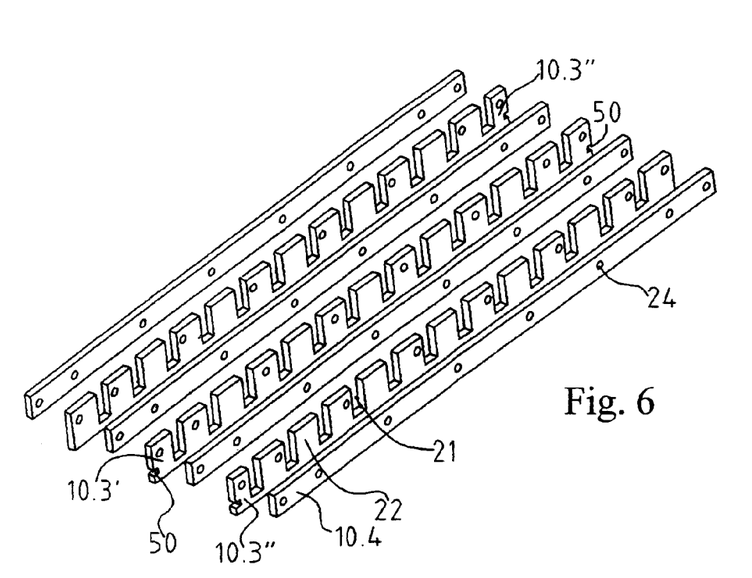
FIGS. 6 and 7 show the sheets of the nozzle plate of the burner embodiment according to FIG. 5 in an exploded illustration (FIG. 6) and arranged in a stack, which forms part of the nozzle plate (FIG. 7)
Figure 7:
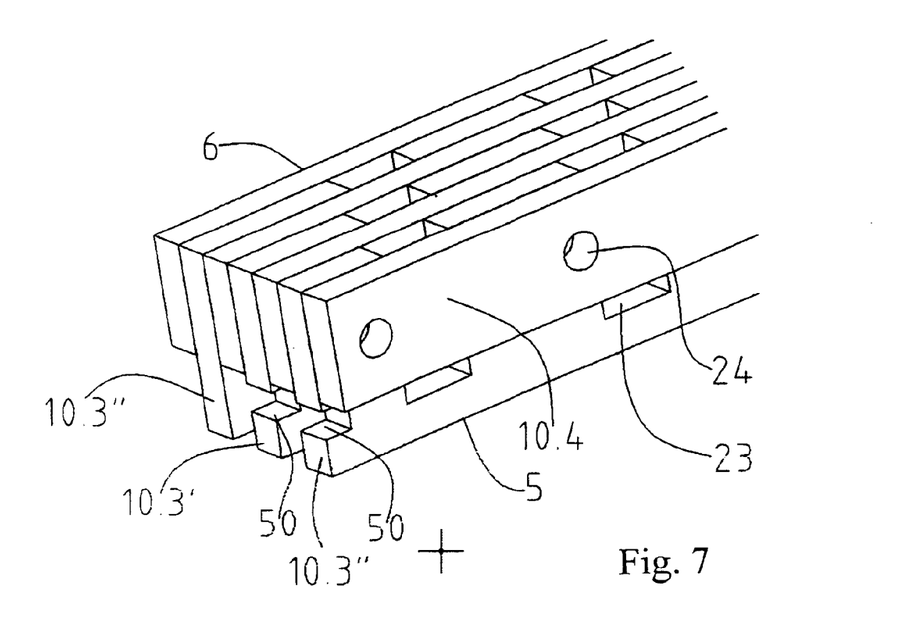

From FIGS. 6 and 7, the sheets 10 are visible on a greater scale, wherein FIG. 6 shows some of the sheets 10 in an exploded manner and FIG. 7 shows a part of the nozzle plate 3, i.e. of the stack of sheets 10. There are again sheets of two types (third type sheets 10.3 and fourth type sheets 10.4), which are stacked in an alternating manner. The third type sheets 10.3 have a comb-like form with a serrated edge facing the flame side 6 of the nozzle plate 3, i.e. comprising in the area of this edge gaps 21 between e.g. rectangular teeth 22. The fourth type sheets 10.4 have a substantially rectangular form with a straight edge facing the flame side of the nozzle plate and in the stack being aligned with the serrated edge of the third type sheets 10.3. The depth of the gaps 21 between the teeth 22 is larger than the width of the fourth type sheets 10.4, such that the bottom ends of these gaps 21 constitute lateral nozzle mouths 23 allowing entrance of the gas from the plenum into the nozzles. Each one of the nozzles 4 is delimited on the flame side of the nozzle plate by two teeth 22 of one third type sheet 10.3 and by two neighboring fourth type sheets 10.4 and has a rectangular or square cross section. This means that the nozzles 4 are arranged in rows, wherein the nozzles of neighboring rows may be aligned with each other or staggered relative to each other as this is the case for the nozzle plate 3 illustrated in FIGS. 5 and 7. In contrast to the nozzle plate according to the publication DE 26 05 954, the limiting walls of the nozzle are straight, i.e. within the real nozzle, the stream of gas does not hit on protruding edges.

The staggering of nozzles as shown in FIGS. 5 to 7 can be realized with a plurality of comb like sheets 10.3 (third type sheets) comprising similar tooth/gap patterns wherein the tooth/gap pattern of first such sheets 10.3' is symmetrical and the sheets comprise a marking (e.g. cut out 50) on either end and wherein the tooth/gap pattern of second such sheets 10.3" is displaced compared with the first sheets 10.3' and therefore asymmetrical and the sheets comprise a marking on only one side. In the stack the third type sheets (alternating with fourth type sheets) are arranged as follows: sheet 10.3" (marking on the left)—sheet 10.3'—sheet 10.3" (marking on the right—and so on.

Further alterations of the stack as illustrated in FIGS. 5 to 7 can be achieved e.g. by stacking two forth type sheets 10.4 between single third type sheets 10.3 or the other way round such decreasing the nozzle density or increasing the nozzle cross section respectively. By using different stacking patterns, it is possible also to produce rows of larger nozzles for treatment flames and smaller nozzles for supporting flames. This can be achieved also by using third type sheets 10.3 with differing gap/tooth patterns.

Instead of stacking comb-like sheets (third type sheets 10.3) and rectangular sheets (fourth type sheets 10.4), it is possible also to use only comb-like sheets comprising gaps 21 between teeth 22 which are deeper than half the sheet width and to arrange the comb-like sheets alternating with their serrated edge facing the flame side of the nozzle plate and the plenum side of the nozzle plate and with the gaps at least partly aligned with each other.

For aligning and fixing the sheets 10 in the stack as shown in FIG. 7, the sheets comprise e.g. alignment bores 24 which are aligned to each other when the sheets are correctly stacked, and rivets or bolts are pushed through the bores and fixed relative to the stack of sheets.

Figure 8:
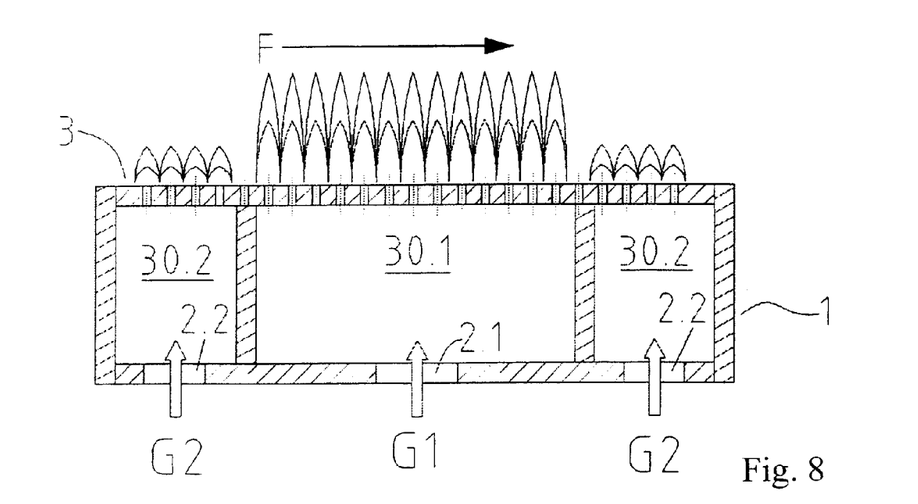
FIG. 8 is a cross section through a further embodiment of the burner according to the invention.

FIG. 8 is a cross section through a further exemplary embodiment of the gas burner according to the invention. The burner comprises again a burner body 1 and a nozzle plate 3, wherein the nozzle plate 3 is e.g. made up of a plurality of first type sheets 10.1 as shown in FIG. 2 and therefore comprises a pattern of identical nozzles.

The plenum of the burner is divided in a central compartment 30.1 and two lateral compartments 30.2 wherein the compartments extend along the length of the burner and each one of the compartments comprises its own gas supply connection (2.1, 2.2). Therein the gases G.1 and G.2 supplied to the plenum parts 30.1 and 30.2 may have a different pressure such that the flames fed from the different compartments have differing sizes as illustrated such constituting e.g. larger treatment flames and smaller supporting flames. Alternatively or in addition, the gases G.1 and G.2 may also be different gases or gas mixtures. For instance, the gas G.2 may be a mixture of a combustible gas and oxygen or air and the gas G.1 may further comprise a precursor of a composition to be deposited on the substrate surface. When the substrate is moved in the direction F past or through the flame band produced by the burner, it will be subject to a pre-treatment (e.g. surface activation), then to a combustion chemical vapor deposition process and then to an after-treatment (e.g. annealing of the deposited coating).

Of course it is possible also to provide plenum compartments supplied with gases comprising different precursors for successive deposition of different compounds.

Alternatively, the plenum compartments G.1, G.2 do not extend along the length of the burner body but along its width, i.e. there are different compartments along the length of the burner body or along the width of a web to be treated respectively. If such compartments are being fed with process gases as e.g. described above, a web is treated differently across its width.

The invention claimed is:

1. A gas burner for establishing an array of flames for a flame treatment of a substrate surface, the gas burner comprising:
    a burner body with a gas supply connection; and
    a nozzle plate;
    wherein the burner body and the nozzle plate together constitute a gas plenum,
    wherein the nozzle plate constitutes a perforated wall section of the gas plenum and comprises a plurality of nozzles extending through the nozzle plate from a plenum side to a flame side of the nozzle plate,
    wherein the nozzle plate is an element which is formed independently from the burner body and comprises a plurality of sheets made of sheet metal comprising determinate through openings,
    wherein said plurality of sheets are arranged in a stack and are fixed to each other,
    wherein all sheets comprise a plurality of the through openings, and in the stack the plurality of through openings of the sheets are aligned to each other to form together the nozzles,
    wherein the plurality of sheets of the nozzle plate includes a plurality of first type sheets with a pattern of identical through openings that are aligned with respect to each other, one of the first type sheets defining the flame side of the nozzle plate,
    wherein each sheet in the stack comprises a planar upper and lower side,
    wherein the upper and lower sides of neighboring sheets in the stack lie surface upon surface against one another within the nozzle plate so that gas is directed to flow through the plurality of nozzles and not between the neighboring sheets in the stack,
    wherein the first type sheet which defines the flame side of the nozzle plate is the furthermost sheet from the plenum side, and wherein the pattern of identical through openings in said first type sheet which defines the flame side of the nozzle plate define nozzle openings having a diameter which is in a longest direction smaller than a length of the nozzles in a gas stream out direction, and
    wherein each nozzle opening feeds one flame of an array of flames produced by the burner on the flame side of the nozzle plate, the array of flames thus being configured for treatment of the substrate surface.

2. The gas burner according to claim 1, wherein the nozzle plate further comprises at least one second type sheet, which constitutes the plenum side of the nozzle plate and which comprises a pattern of through openings that is at least partly the same pattern of through openings as the first type sheet which defines the flame side of the nozzle plate, wherein the pattern of through openings of the second type sheet is displaced relative to the pattern of through openings of the first type sheets, and wherein the displacement (d) is smaller than the dimension of the cross section of the through openings of the pattern of through openings of the first type sheets.

3. The gas burner according to claim 2, wherein the second type sheet comprises further through openings which are larger than the cross section of the through opening of the pattern of the first type sheets.

4. The gas burner according to claim 1, wherein the sheets are fixed to each other by being clamped against each other in a predetermined position relative to the burner body.

5. The gas burner according to claim 1, wherein the sheets are made by punching, laser-cutting, jet-cutting or milling.

6. The gas burner according to claim 1, wherein the sheets have a thickness of between 0.5 and 2 mm.

7. The gas burner according to claim 1, wherein the sheets consist of steel, brass or bronze.

8. The gas burner according to claim 1, wherein the sheets further comprise alignment bores, and wherein the sheets are fixed to each other by bolts or rivets extending through the alignment bores.

9. The gas burner according to claim 1, wherein the plenum comprises a plurality of plenum compartments, and wherein each of the plurality of plenum compartments comprises a separate gas supply connection.

10. The gas burner according to claim 9, wherein the nozzle plate has a rectangular form and the plurality of plenum compartments extend parallel to a length or to a width of the nozzle plate.

11. A method for flame treatment comprising the steps of:
    providing a substrate having a surface for receiving flame treatment;
    providing a gas burner comprising
        a burner body with a gas supply connection, and
        a nozzle plate,
            wherein the burner body and the nozzle plate together constitute a gas plenum,
            wherein the nozzle plate constitutes a perforated wall section of the gas plenum and comprises a plurality of nozzles extending through the nozzle plate from a plenum side to a flame side of the nozzle plate,
            wherein the nozzle plate is an element which is formed independently from the burner body and comprises a plurality of sheets made of sheet metal comprising determinate through openings,
            wherein said plurality of sheets are arranged in a stack and are fixed to each other,
            wherein all sheets comprise a plurality of the through openings, and in the stack the plurality of through openings of the sheets are aligned to each other to form together the nozzles,
            wherein the plurality of sheets of the nozzle plate includes a plurality of first type sheets with a pattern of identical through openings that are aligned with respect to each other, one of the first type sheets defining the flame side of the nozzle plate,
            wherein each sheet in the stack comprises a planar upper and lower side,
            wherein the upper and lower sides of neighboring sheets in the stack lie surface upon surface against one another within the nozzle plate so that gas is directed to flow through the plurality of nozzles and not between the neighboring sheets in the stack,
            wherein the first type sheet which defines the flame side of the nozzle plate is the furthermost sheet from the plenum side, and wherein the pattern of identical through openings in said first type sheet which defines the flame side of the nozzle plate define nozzle openings having a diameter which is in a longest direction smaller than a length of the nozzles in a gas stream out direction, and wherein each nozzle opening feeds one flame of an array of flames produced by the burner on the flame side of the nozzle plate, the array of flames thus being configured for treatment of the substrate surface; and treating the substrate surface with the array of flames.

12. The method according to claim 11, wherein the substrate has the form of a quasi endless web and is transported on a rotating drum past or through a flame band produced by the burner.

13. The method according to claim 11, wherein the flame treatment is a combustion chemical vapor deposition process.

14. The method according to claim 11, wherein the plenum comprises a plurality of plenum compartments, wherein each of the plurality of plenum compartments comprises a separate gas supply connection, and wherein different gases or gases of different pressures are supplied to different plenum compartments using the separate gas supply connections.

* * * * *